(12) United States Patent
Tu et al.

(10) Patent No.: US 10,217,848 B2
(45) Date of Patent: Feb. 26, 2019

(54) THIN FILM TRANSISTOR STRUCTURE AND MANUFACTURING METHOD OF THE SAME

(71) Applicant: Wuhan China Star Optoelectronics Technology Co., Ltd., Wuhan (CN)

(72) Inventors: Wanghua Tu, Wuhan (CN); Wanting Yin, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 15/303,047

(22) PCT Filed: Jun. 12, 2016

(86) PCT No.: PCT/CN2016/085489
§ 371 (c)(1),
(2) Date: Oct. 10, 2016

(87) PCT Pub. No.: WO2017/185490
PCT Pub. Date: Nov. 2, 2017

(65) Prior Publication Data
US 2017/0317189 A1    Nov. 2, 2017

(51) Int. Cl.
*H01L 29/66* (2006.01)
*H01L 29/786* (2006.01)
*H01L 21/266* (2006.01)
*H01L 21/265* (2006.01)

(52) U.S. Cl.
CPC ...... *H01L 29/66757* (2013.01); *H01L 21/266* (2013.01); *H01L 21/26513* (2013.01); *H01L 29/78603* (2013.01); *H01L 29/78633* (2013.01); *H01L 29/78675* (2013.01)

(58) Field of Classification Search
CPC .......... H01L 29/6675; H01L 29/78663; H01L 29/78693; H01L 27/1214; H01L 29/78618; H01L 29/78672; H01L 21/2652; H01L 29/78633; H01L 29/78609; H01L 23/5329;
(Continued)

(56) References Cited

U.S. PATENT DOCUMENTS 5,624,861 A * 4/1997 Shibuya .............. H01L 27/1214
                                                    438/164
6,262,436 B1   7/2001 Nakata
(Continued)

FOREIGN PATENT DOCUMENTS

| CN | 102789971 | 11/2012 |
| CN | 105185792 | 12/2015 |
| JP | 2297968 | 12/1990 |

OTHER PUBLICATIONS

Machine translation of CN101067705.*

*Primary Examiner* — Sonya D. McCall-Shepard

(57) ABSTRACT

A thin film transistor (TFT) structure is provided herein, which comprises a substrate, a light-shielding resin, a polysilicon, a gate electrode insulator, a gate electrode, an interlayer dielectric layer, a source electrode, and a drain electrode. The light-shielding resin has functions of light-shielding and insulation. With doping through two through holes at two sides, the manufacturing process is simplified, the exposure process is simplified, the production time is shortened, the usage of masks is decreased, and the production cost is lowered.

13 Claims, 9 Drawing Sheets

(58) Field of Classification Search
CPC ............. H01L 23/532; H01L 29/66757; H01L 21/266; H01L 29/78675
See application file for complete search history.

(56) References Cited

U.S. PATENT DOCUMENTS

| | | | |
|---|---|---|---|
| 6,597,121 B2 * | 7/2003 | Imura | H01L 27/3272 313/500 |
| 6,818,967 B2 * | 11/2004 | Chen | H01L 29/78675 257/359 |
| 9,502,446 B2 | 11/2016 | Zhang | |
| 2007/0090365 A1 * | 4/2007 | Hayashi | H01L 29/7869 257/72 |
| 2011/0198607 A1 * | 8/2011 | Mori | H01L 29/78621 257/72 |
| 2017/0184887 A1 | 6/2017 | Xiao | |

* cited by examiner

THIN FILM TRANSISTOR STRUCTURE AND MANUFACTURING METHOD OF THE SAME

RELATED APPLICATIONS

This application is a National Phase of PCT Patent Application No. PCT/CN2016/085489 having International filing date of Jun. 12, 2016, which claims the benefit of priority of Chinese Patent Application No. 201610273749.2 filed on Apr. 28, 2016. The contents of the above applications are all incorporated by reference as if fully set forth herein in their entirety.

FIELD AND BACKGROUND OF THE INVENTION

The present invention relates to a thin film transistor (TFT) structure and a manufacturing method of the same, and more particularly to a field of low temperature poly silicon (LTPS) TFT.

In the conventional art, the manufacturing process of the low temperature poly silicon (LTPS) thin film transistor (TFT) is: disposing a substrate, a light-shield (LS), a triple-layers structure (SiNx, SiOx, polysilicon), a channel doping, an N doping, a gate electrode insulator, a gate electrode, a P doping, an interlayer dielectric (ILD), a bottom indium tin oxide (BITO), a passivation layer (PV), and a top indium tin oxide (TITO). The LS is removed after being used, which increases the manufacturing process, the quantity of masks, the production time, and the production cost.

In the conventional art, the two dopings applied to the polysilicon are performed by masks, hence, decreasing the usage of masks is a technical issue needing to be solved.

Please refer to publication No. CN 200710122171 of State intellectual property office of the P.R.C., which proposes a LS disposed on the TFT structure of a substrate. Since the LS is made by metal, an insulation layer is needed to be inserted between the LS and the TFT structure, which still increases the manufacturing process, the quantity of masks, the production time, and the production cost.

Hence, it is necessary to provide a TFT structure and a manufacturing method of the same to solve the technical issue.

SUMMARY OF THE INVENTION

An objective of the present invention is to provide a thin film transistor (TFT) structure, which comprises a substrate, a light-shielding resin, a polysilicon, a gate electrode insulator, a gate electrode, an interlayer dielectric layer, a source electrode, and a drain electrode.

The light-shielding resin is disposed on the substrate. The polysilicon is disposed on the light-shielding resin. The gate electrode insulator is disposed on the substrate and the polysilicon. The gate electrode is disposed close to the gate electrode insulator. An interlayer dielectric layer is disposed on the gate electrode insulator and the gate electrode. A source electrode and a drain electrode are disposed on the interlayer dielectric layer. The source electrode and the drain electrode are respectively connected with the polysilicon by two through holes.

In one preferred embodiment, the through holes penetrate the interlayer dielectric layer and a portion of the gate electrode insulator.

In one preferred embodiment, the light-shielding resin comprises an epoxy resin or polyurethane.

In one preferred embodiment, the TFT structure further comprises a planar and a transparent conduction layer, the planar is disposed on a portion of the source electrode and the drain electrode, and overlaps the interlayer dielectric layer; the transparent conduction layer is disposed on the planar and another portion of the source electrode and the drain electrode.

In one preferred embodiment, the polysilicon comprises a channel-doping region and two through-hole-doping regions, the through-hole-doping regions and the two through holes connect with each other, the source electrode and the drain electrode are connected with the through-hole-doping regions on two sides of the channel-doping region by the two through holes.

An objective of the present invention is to provide a TFT structure manufacturing method, which comprises: first, a substrate is deposited; then, a resin layer is deposited on the substrate, and a first mask is used to form a light-shielding resin; then, a polysilicon layer is deposited, and a second mask is used to form a polysilicon on the light-shielding resin; then, a first doping is performed on the polysilicon; a gate electrode insulator is deposited on the substrate and the polysilicon; then, a first metal layer is deposited, and a third mask is used to form a gate electrode on the gate electrode insulator; then, an interlayer dielectric layer is deposited on the gate electrode insulator and the gate electrode; then, a fourth mask is used to form two through holes in the interlayer dielectric layer and a portion of the gate electrode insulator; then, a second metal layer is deposited, and a fifth mask is used to form a source electrode and a drain electrode on the interlayer dielectric layer. The source electrode and the drain electrode are respectively connected with the polysilicon by two through holes.

In one preferred embodiment, a doping to the polysilicon comprises the first doping and a second doping. The first doping is performed on the polysilicon after forming the polysilicon and before depositing the gate electrode insulator. The second doping is performed on the polysilicon through the two through holes after forming the two through holes.

In one preferred embodiment, the polysilicon is completely doped in the first doping.

In one preferred embodiment, a channel-doping region of the polysilicon is doped and through-hole-doping regions on two sides of the channel-doping region are not doped under the protection of the mask in the first doping.

In one preferred embodiment, the through-hole-doping regions and the two through holes connect with each other, to dope the through-hole-doping regions through the through holes by the second doping, to make the polysilicon form the channel-doping region and the through-hole-doping regions on two sides of the channel-doping region.

In one preferred embodiment, the through-hole-doping regions and the two through holes connect with each other, to dope the through-hole-doping regions through the through holes by the second doping, to make the polysilicon form the channel-doping region and the through-hole-doping regions on two sides of the channel-doping region.

With the technical proposal of the present invention, the beneficial effect is: with the light-shielding resin which has functions of light-shield and insulation, an insulation layer is no longer disposed; besides, channel doping is performed on the polysilicon to make the polysilicon channel (where the region of the polysilicon corresponds with the gate electrode) to be N type or P type, in other words, with doping through the through holes on two ends to simplify the manufacturing process, simplify the exposure process, shorten the production time, decrease the usage of masks, and lower the production cost.

DESCRIPTION OF SPECIFIC EMBODIMENTS OF THE INVENTION

The following description of each embodiment, with reference to the accompanying drawings, is used to exemplify specific embodiments which may be carried out in the present invention. Directional terms mentioned in the present invention, such as "top", "bottom", "front", "back", "left", "right", "inside", "outside", "side", etc., are only used with reference to the orientation of the accompanying drawings. Therefore, the used directional terms are intended to illustrate, but not to limit, the present invention.

Figure 18:
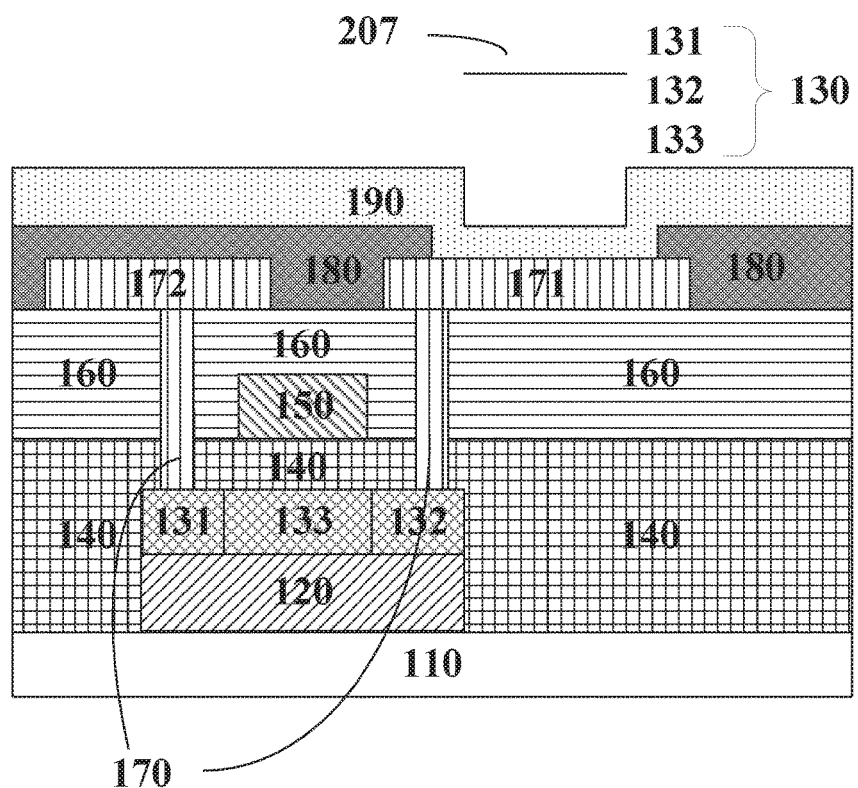

Please refer to FIG. 18, which is a side view drawing of the thin film transistor (TFT) structure 100 of the present invention. The TFT structure 100 comprises a substrate 110, a light-shielding resin 120, a polysilicon 130, a gate electrode insulator 140, a gate electrode 150, an interlayer dielectric layer 160, a source electrode 172, a drain electrode 171, a planar 180, and a transparent conduction layer 190.

The light-shielding resin 120 is disposed on the substrate 110. In detail, the light-shielding resin 120 comprises an epoxy resin or polyurethane. The light-shielding resin 120 can not only shielding light but also serve as an insulation layer.

The polysilicon 130 is disposed on the light-shielding resin 120. The polysilicon 130 is used to provide electrons and holes for conduction. In detail, an area of the polysilicon 130 and an area of the light-shielding resin 120 are the same (perpendicular with the light's direction). The polysilicon 130 comprises a channel-doping region 133 and two through-hole-doping regions (131, 132), the through-hole-doping regions (131, 132) and the two through holes 170 connect with each other, the source electrode 172 and the drain electrode 171 are connected with the through-hole-doping regions (131, 132) on two sides of the channel-doping region 133 by the two through holes 170.

Figure 8:
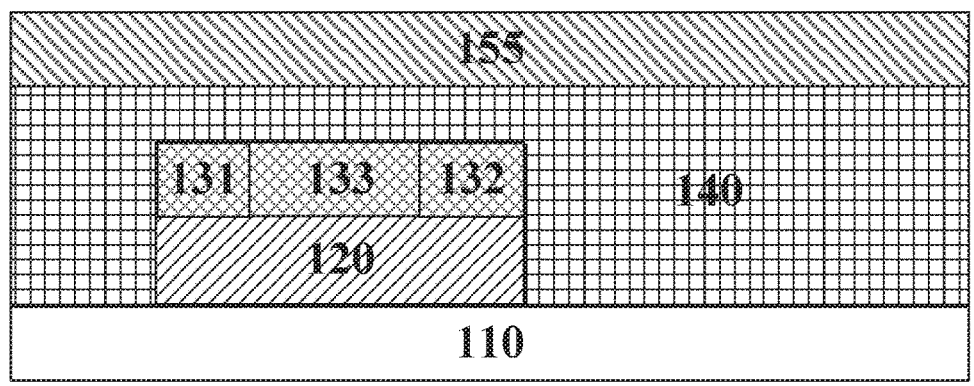
Figure 9:
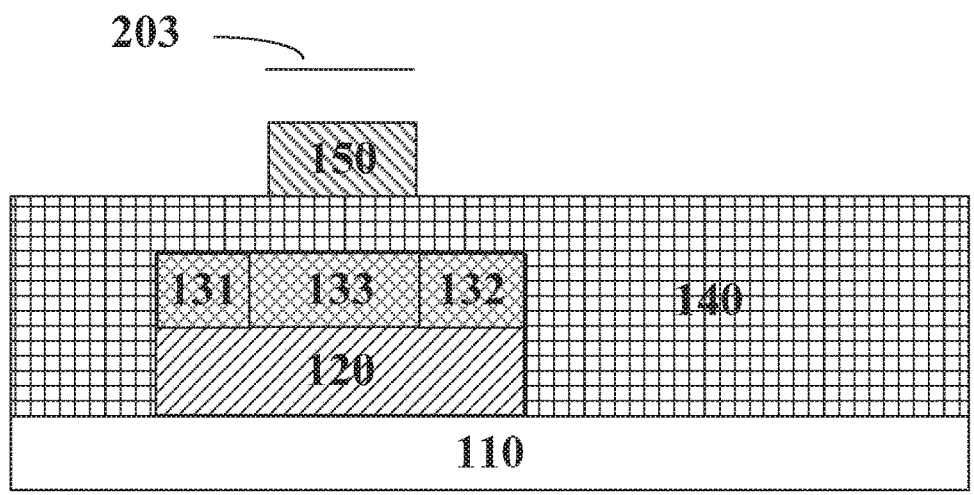

The gate electrode insulator 140 is disposed on the substrate 110 and the polysilicon 130. In detail, the light-shielding resin 120 is disposed on a region where the polysilicon 130 and the gate electrode 150 are disposed, to avoid making the polysilicon generate a light leakage current. In other words, an area of the light-shielding resin 120 is larger than or equal to an area of the polysilicon 130 (perpendicular with the light's direction). The first metal layer 155 used to form the gate electrode 150 can be molybdenum. Referring to FIGS. 8-9, the gate electrode 150 are formed by using a third mask on the first metal layer 155. The gate electrode insulator has high dielectric constant.

The interlayer dielectric layer 160 is disposed on the gate electrode insulator 140 and the gate electrode 150. In detail, the interlayer dielectric layer 160 completely covers the gate electrode 150 and other regions. The interlayer dielectric layer 160 is used to lower the capacitance value between the multi-layer wires. Generally, laminated layers of oxidized silicon-silicon nitride-oxidized silicon or laminated layers of oxidized silicon-silicon nitride are used to be flash memory of the interlayer dielectric layer 160.

The through holes 170 penetrate the interlayer dielectric layer 160 and a portion of the gate electrode insulator 140. In detail, two through holes 170 penetrate the gate electrode insulator 140 and the interlayer dielectric layer 160. For the two through holes 170 are deposited with the same material, the source electrode 172 and the drain electrode 171 respectively connect with two sides of the polysilicon 130.

In the preferred embodiment, the drain electrode 171 and the source electrode 172 are disposed on the interlayer dielectric layer 160. However, in different preferred embodiments, the drain electrode 171 and the source electrode 172 can change position. A second metal layer used to form the drain electrode 171 and the source electrode 172 can be molybdenum/aluminum/molybdenum.

The planar 180 is disposed on a portion of the drain electrode 171 and the source electrode 172, and overlapping the interlayer dielectric layer 160. In the preferred embodiment, the planar 180 completely overlaps the source electrode 172, however, only partially overlaps the drain electrode 171.

The transparent conduction layer 190 is disposed on the planar 180 and another portion of the drain electrode 171 and the source electrode 172. In the preferred embodiment, the transparent conduction layer 190 directly overlaps the drain electrode 171 which is not be overlapped by the planar 180. The transparent conduction layer 190 can be indium tin oxide.

A doping to the polysilicon 130 comprises the first doping and a second doping. The first doping is performed on the polysilicon 130 after forming the polysilicon 130 and before depositing the gate electrode insulator 140. The second doping is performed on the two through-hole-doping regions (131,132) of the polysilicon 130 through the two through holes 170 after forming the two through holes 170.

Figure 1:
FIGS. 1, 2, 3, 4, 5, 6-1, 6-2, 7, 8, 9, 10, 11, 12, 13, 14, 15, 16, 17 and 18 are side view drawings of each manufacturing process of the thin film transistor (TFT) of the present invention.
Figure 19:
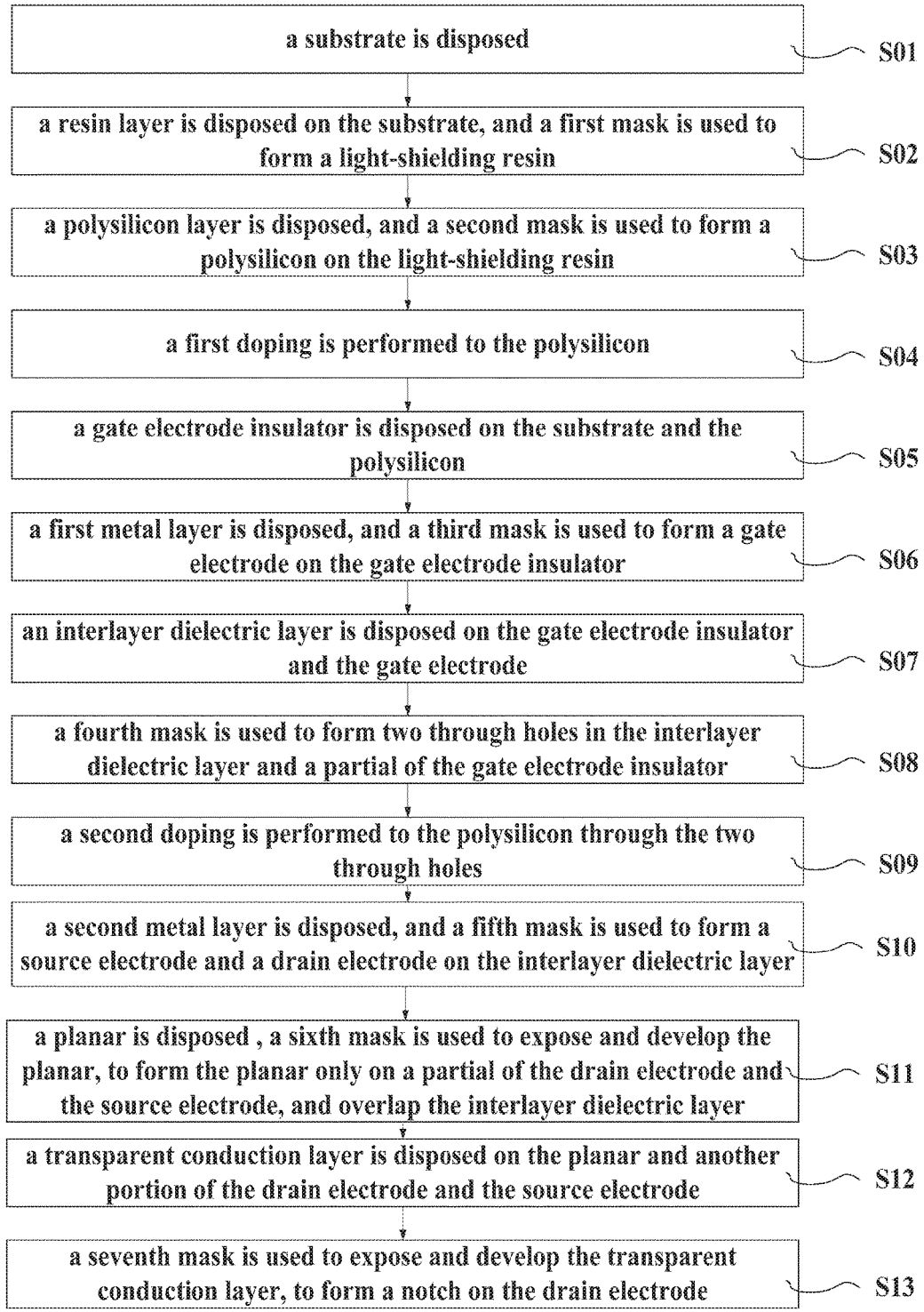
FIG. 19 is a flowchart of a method of manufacturing the TFT structure according to the present invention.

Please refer to FIGS. 1-19, FIGS. 1-18 are side view drawings of each manufacturing process of the TFT of the present invention. FIG. 19 is a flowchart of a method of manufacturing the TFT structure 100 according to the present invention. The method comprises:

Step S01: as shows in FIG. 1, a substrate 110 is disposed. The substrate 110 can be a glass substrate or a transparent plastic baseplate.

Figure 2:
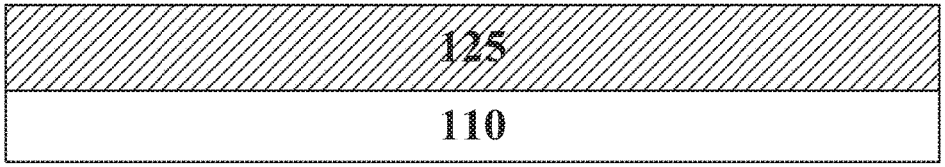
Figure 3:

Step S02: as shows in FIG. 2, a resin layer 125 is deposited on the substrate 110. As FIG. 3 shows, the resin layer 125 is exposed and developed to form a light-shielding resin 120 by using a first mask 201.

Figure 4:
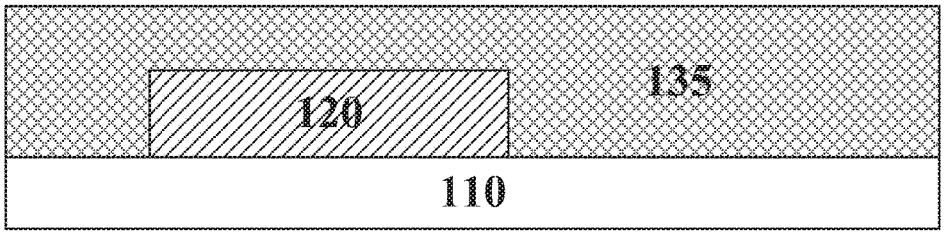
Figure 5:
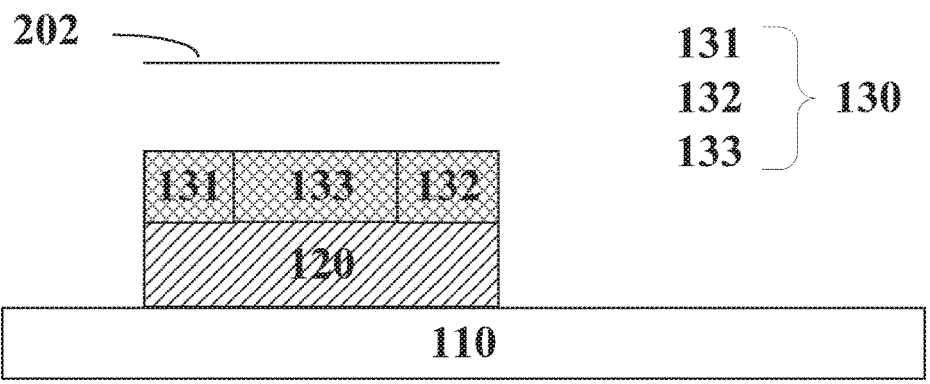

Step S03: as shows in FIG. 4, a polysilicon layer 135 is deposited. As FIG. 5 shows, the polysilicon layer 135 is exposed and developed to form a polysilicon 130 on the light-shielding resin 120 by using a second mask 202.

Figures 1, 6:
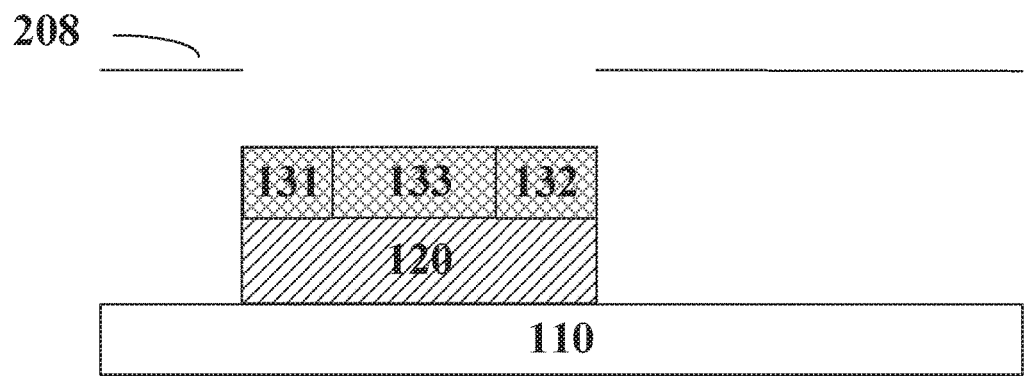
Figures 2, 6:
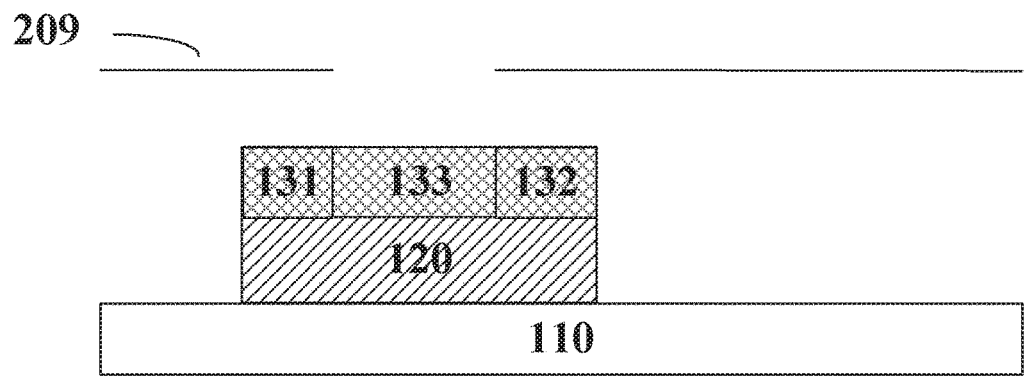

Step S04: as shows in FIG. 6-1, a first doping is performed on the polysilicon 130 by using a first doping mask 208. In the preferred embodiment, the polysilicon 130 is whole and evenly doped.

In another preferred embodiment, as FIG. 6-2 shows, a first doping is performed on the polysilicon 130 by using a second doping mask 209. In the preferred embodiment, channel-doping region 133 of the polysilicon 130 is doped; through-hole-doping regions (131,132) on two sides of the channel-doping region are protected from doping during the mask process.

Figure 7:
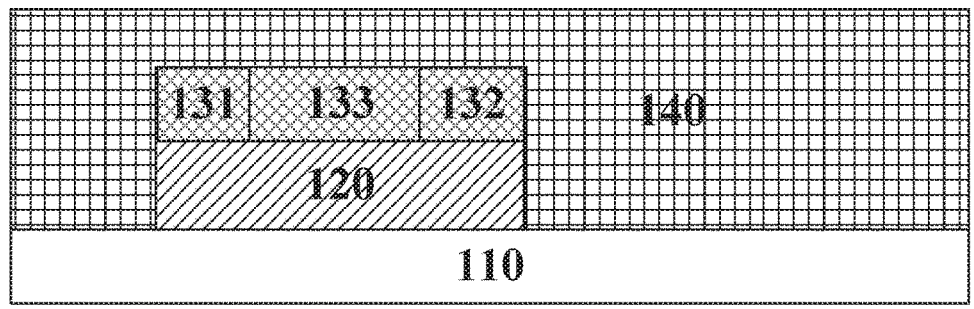

Step S05: as shows in FIG. 7, a gate electrode insulator 140 is deposited on the substrate 110 and the polysilicon 130. The gate electrode insulator 140 can be SiOx, SiNx, or a combination of both.

Step S06: as shows in FIG. 8, a first metal layer 155 is deposited by a chemical vapor deposition (CVD) or a vacuum evaporation (VE). As shows in FIG. 9, a third mask 203 is used to expose and develop the first metal layer 155, to form a gate electrode 150 on the gate electrode insulator 140. Generally, the first metal layer 155 can be molybdenum (Mo), aluminum (Al), aluminum alloy, titanium (Ti), copper (Cu), or wolfram (W).

Figure 10:
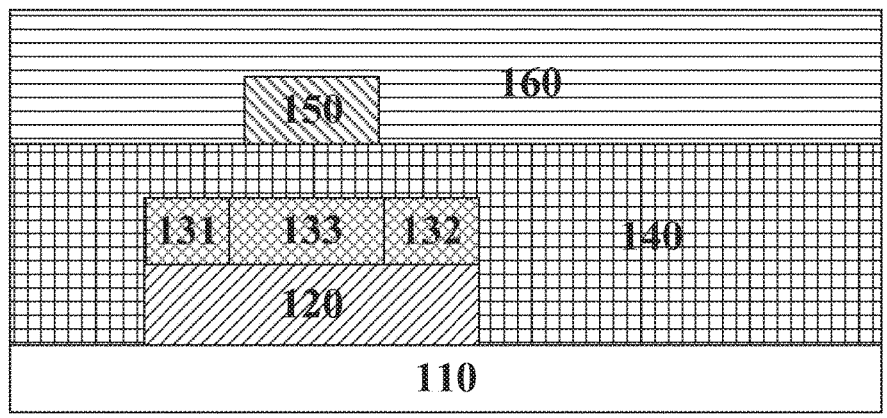

Step S07: as shown in FIG. 10, an interlayer dielectric layer 160 is deposited on the gate electrode insulator 140 and the gate electrode 150.

Figure 11:
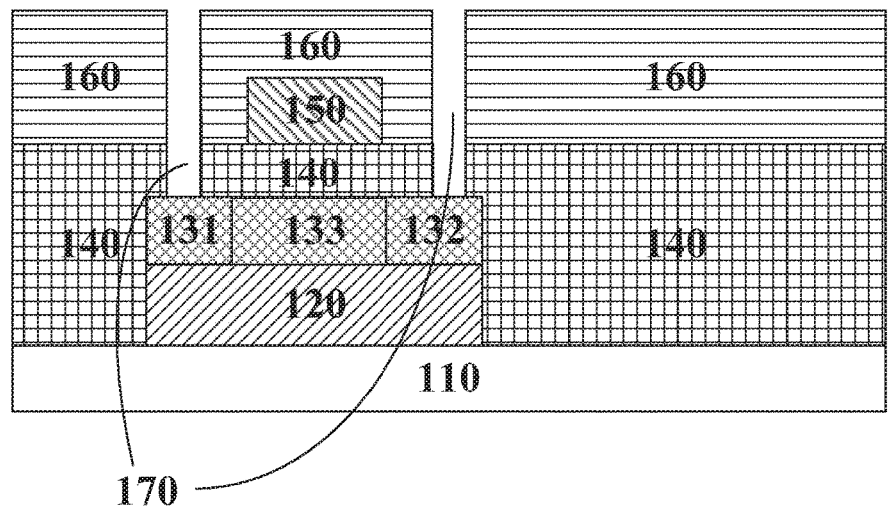
Figure 12:
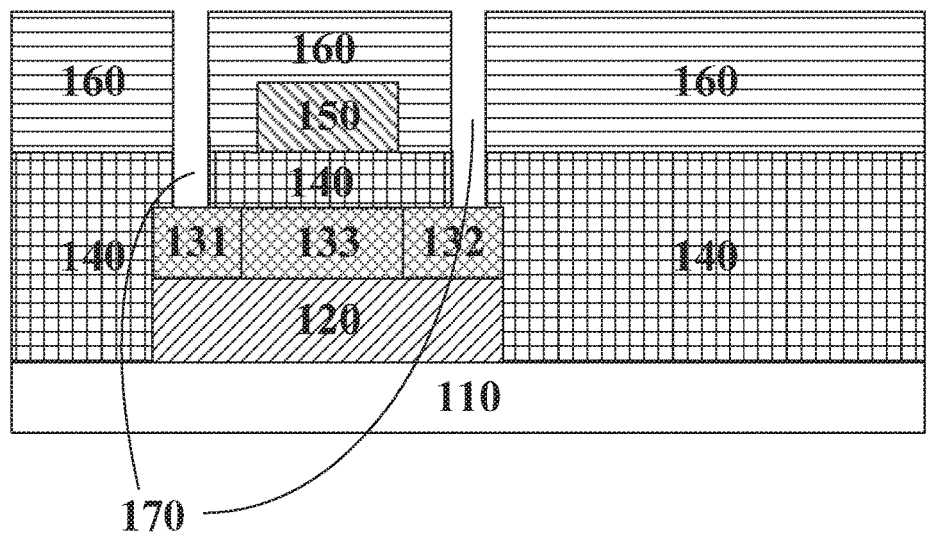

Step S08: as shown in FIG. 11, a fourth mask 204 is used to expose and develop the interlayer dielectric layer 160 and the gate electrode insulator 140, to form two through holes 170 in the interlayer dielectric layer 160 and a portion of the gate electrode insulator 140.

Step S09: a second doping is performed on the polysilicon 130 through the two through holes 170. The through-hole-doping regions (131,132) are connected with the two through holes 170. With the second doping to the through-hole-doping regions (131,132), the polysilicon 130 forms the channel-doping region and the through-hole-doping regions (131,132) on two sides of the channel-doping region 133.

Figure 13:
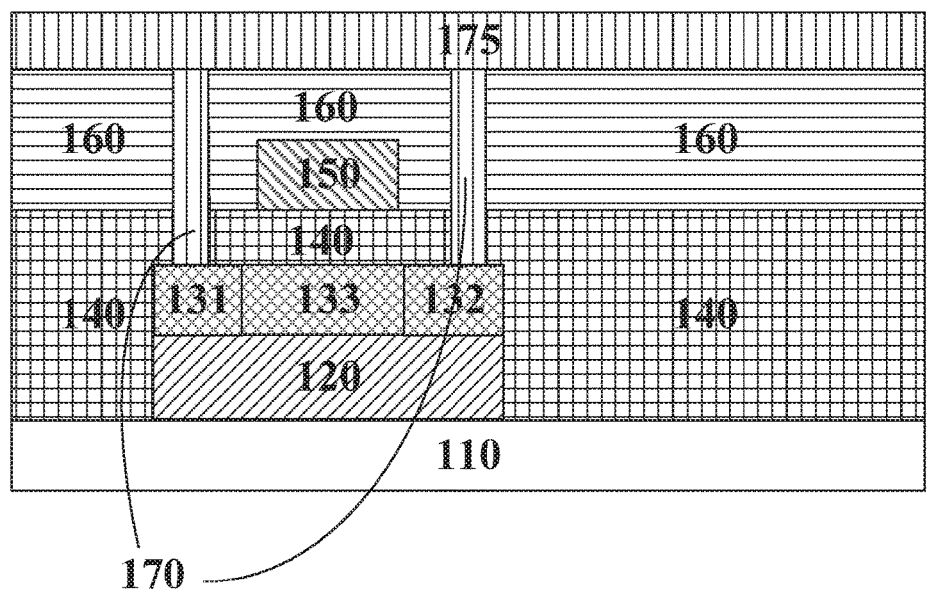
Figure 14:
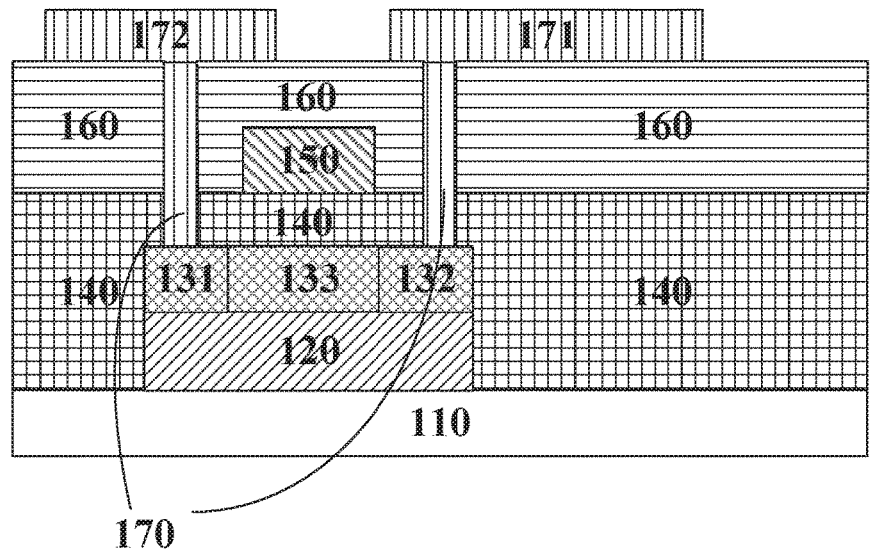

Step S10: as shown in FIG. 13, a second metal layer 175 is deposited by a chemical vapor deposition (CVD) or a vacuum evaporation (VE). As FIG. 14 shows, a fifth mask 205 is used to expose and develop the second metal layer 175, to form a drain electrode 171 and a source electrode 172 on the interlayer dielectric layer 160. For the second metal layer 175 fills the two through holes 170, the drain electrode 171 and the source electrode 172 are respectively connected with the polysilicon 130 by two through holes 170.

Figure 15:
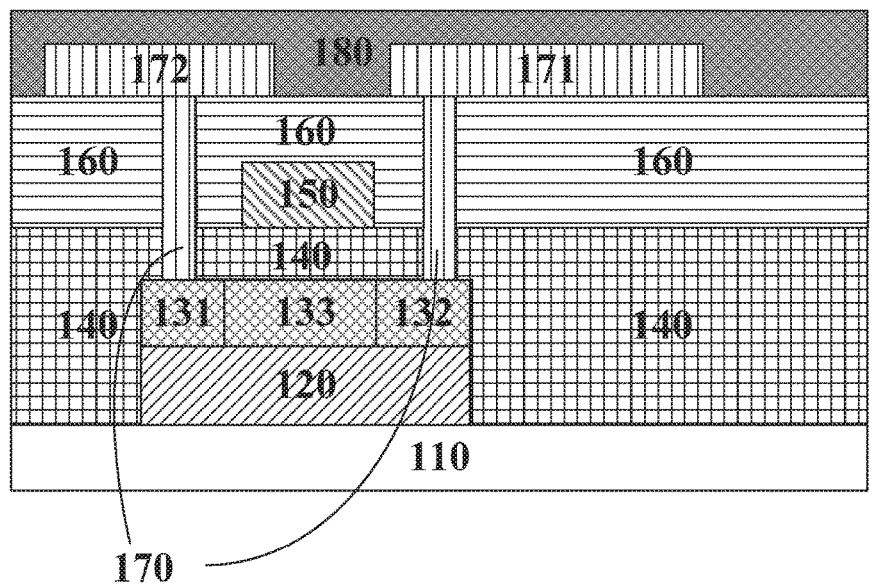
Figure 16:
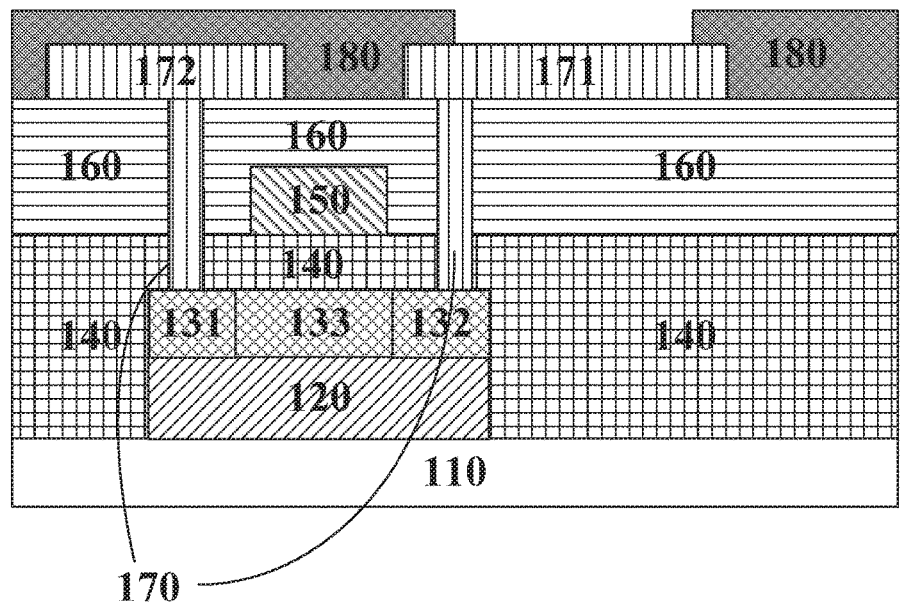

Step S11: as shown in FIG. 15, a planar 180 is deposited. As shows in FIG. 16, a sixth mask 206 is used to expose and develop the planar 180, to form the planar 180 only on a portion of the drain electrode 171 and the source electrode 172, and overlap the interlayer dielectric layer 160.

Figure 17:
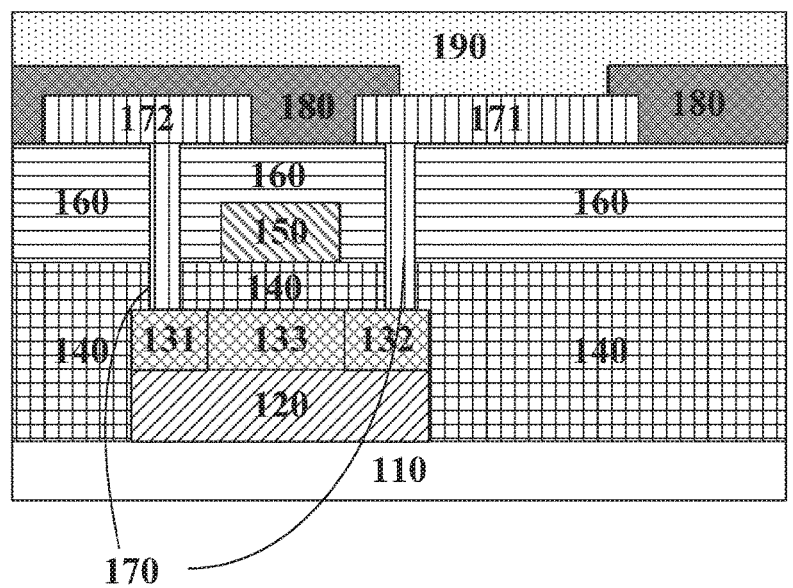

Step S12: as shown in FIG. 17, a transparent conduction layer 190 is deposited on the planar 180 and another portion of the drain electrode 171 and the source electrode 172.

Step S13: as shown in FIG. 18, a seventh mask 207 is used to expose and develop the transparent conduction layer 190, to form a notch on the drain electrode 171.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A Thin Film Transistor (TFT) structure, comprising:
a substrate;
a single-layered light-shielding resin, disposed on the substrate, wherein the single-layered light-shielding resin comprises an epoxy resin or polyurethane;
a polysilicon, disposed on the single-layered light-shielding resin;
a gate electrode insulator, disposed on the substrate and the polysilicon;
a gate electrode, disposed close to the gate electrode insulator;
an interlayer dielectric layer, disposed on the gate electrode insulator and the gate electrode;
a source electrode and a drain electrode, disposed on the interlayer dielectric layer;
wherein the source electrode and the drain electrode are respectively connected with the polysilicon via two through holes; the polysilicon comprises a channel-doping portion and two through-hole-doping portions; the through-hole-doping portions and the two through holes connect with each other; the source electrode and the drain electrode are connected with the through-hole-doping portions on two sides of the channel-doping portion by the two through holes, the channel-doping portion is directly disposed between the two through-hole-doping portions.

2. The TFT structure according to claim 1, wherein the through holes penetrate the interlayer dielectric layer and a portion of the gate electrode insulator.

3. The TFT structure according to claim 1, further comprising:
a planar, disposed on a portion of the source electrode and the drain electrode, and overlapping the interlayer dielectric layer; and
a transparent conduction layer, disposed on the planar and another portion of the source electrode and the drain electrode.

4. A Thin Film Transistor (TFT) structure, comprising:
a substrate;
a single-layered light-shielding resin, disposed on the substrate, wherein the single-layered light-shielding resin comprises an epoxy resin or polyurethane;
a polysilicon, disposed on the single-layered light-shielding resin;
a gate electrode insulator, disposed on the substrate and the polysilicon;
a gate electrode, disposed close to the gate electrode insulator;
an interlayer dielectric layer, disposed on the gate electrode insulator and the gate electrode;
a source electrode and a drain electrode, disposed on the interlayer dielectric layer;
wherein the source electrode and the drain electrode are respectively connected with the polysilicon by two through holes, the polysilicon comprises a channel-doping portion and two through-hole-doping portions, and the channel-doping portion is directly disposed between the two through-hole-doping portions.

5. The TFT structure according to claim 4, wherein the through holes penetrate the interlayer dielectric layer and a portion of the gate electrode insulator.

6. The TFT structure according to claim 4, further comprising:
a planar, disposed on a portion of the source electrode and the drain electrode, and overlapping the interlayer dielectric layer; and
a transparent conduction layer, disposed on the planar and another portion of the source electrode and the drain electrode.

7. The TFT structure according to claim 4, wherein the through-hole-doping portions and the two through holes connect with each other and complete doping by the two through holes, the source electrode and the drain electrode are connected with the through-hole-doping portions on two sides of the channel-doping portion by the two through holes.

8. A TFT structure manufacturing method, comprising:
disposing a substrate;
- depositing a resin layer on the substrate, and forming a light-shielding resin by using a first mask;
- depositing a polysilicon layer, and forming a polysilicon on the light-shielding resin by using a second mask;
- performing a first doping to the polysilicon;
- depositing a gate electrode insulator on the substrate and the polysilicon;
- depositing a first metal layer, and using a third mask to form a gate electrode on the gate electrode insulator;
- depositing an interlayer dielectric layer on the gate electrode insulator and the gate electrode;
- using a fourth mask to form two through holes in the interlayer dielectric layer and a portion of the gate electrode insulator; and
- depositing a second metal layer, and using a fifth mask to form a source electrode and a drain electrode on the interlayer dielectric layer;
- wherein the source electrode and the drain electrode are respectively connected with the polysilicon by two through holes.

9. The TFT structure manufacturing method according to claim 8, wherein a doping to the polysilicon comprises the first doping and a second doping:
- the first doping is performed on the polysilicon after forming the polysilicon and before depositing the gate electrode insulator; and
- the second doping is performed on the polysilicon through the two through holes after forming the two through holes.

10. The TFT structure manufacturing method according to claim 9, wherein the polysilicon is completely doped in the first doping.

11. The TFT structure manufacturing method according to claim 9, wherein a channel-doping region of the polysilicon is doped and through-hole-doping regions on two sides of the channel-doping region are not doped under the protection of the mask in the first doping.

12. The TFT structure manufacturing method according to claim 10, wherein the through-hole-doping regions connected to the two through holes are doped through the two through holes in the second doping, so that the polysilicon forms the channel-doping region and the through-hole-doping regions on two sides of the channel-doping region.

13. The TFT structure manufacturing method according to claim 11, wherein the through-hole-doping regions connected to the two through holes are doped through the two through holes in the second doping, so that the polysilicon forms the channel-doping region and the through-hole-doping regions on two sides of the channel-doping region.

* * * * *

UNITED STATES PATENT AND TRADEMARK OFFICE
CERTIFICATE OF CORRECTION

PATENT NO. : 10,217,848 B2
APPLICATION NO. : 15/303047
DATED : February 26, 2019
INVENTOR(S) : Wanghua Tu et al.

Page 1 of 1

It is certified that error appears in the above-identified patent and that said Letters Patent is hereby corrected as shown below:

On the Title Page

Item (30) Foreign Application Priority Data
Insert the following:
-- Apr. 28, 2016 (CN)............... 201610273749.2 --

Signed and Sealed this
Twenty-first Day of May, 2019

Andrei Iancu
*Director of the United States Patent and Trademark Office*